US 9,496,836 B2

(12) United States Patent
Qureshi (10) Patent No.: US 9,496,836 B2
(45) Date of Patent: Nov. 15, 2016

(54) DOHERTY AMPLIFIER (71) Applicant: Ampleon Netherlands B.V., Nijmegen (NL)

(72) Inventor: Jawad Qureshi, Bemmel (NL)

(73) Assignee: Ampleon Netherlands B.V., Nijmegen (NL)

(*) Notice: Subject to any disclaimer, the term of this patent is extended or adjusted under 35 U.S.C. 154(b) by 0 days.

(21) Appl. No.: 14/284,479

(22) Filed: May 22, 2014

(65) Prior Publication Data

US 2014/0347133 A1  Nov. 27, 2014

(30) Foreign Application Priority Data

May 23, 2013 (EP) ..................................... 13168944

(51) Int. Cl.
| H03F 3/68 | (2006.01) |
| H03F 3/24 | (2006.01) |
| H03F 3/195 | (2006.01) |
| H03F 3/193 | (2006.01) |
| H03F 1/02 | (2006.01) |
| H03F 1/07 | (2006.01) |

(52) U.S. Cl.
CPC ........ *H03F 3/68* (2013.01); *H03F 1/07* (2013.01); *H03F 3/193* (2013.01); *H03F 3/195* (2013.01); *H03F 3/245* (2013.01); *H03F 2200/255* (2013.01); *H03F 2200/423* (2013.01); *H03F 2200/451* (2013.01)

(58) Field of Classification Search
USPC .................... 330/295, 124 R, 84, 286, 53
See application file for complete search history.

(56) References Cited

U.S. PATENT DOCUMENTS

| 5,568,086 | A | 10/1996 | Schuss et al. | |
| 7,893,770 | B2* | 2/2011 | Yamauchi | H03F 1/0238 |
| | | | | 330/124 R |
| 8,749,306 | B2* | 6/2014 | Pengelly | 330/124 R |
| 8,988,147 | B2* | 3/2015 | Liu | 330/124 R |
| 9,209,511 | B2* | 12/2015 | Mei | H01P 5/12 |

(Continued)

FOREIGN PATENT DOCUMENTS

| EP | 1 912 328 A1 | 4/2008 |
| JP | 2006 148523 A | 6/2006 |

OTHER PUBLICATIONS

Doherty, W.H.; "A New High Efficiency Power Amplifier for Modulated Waves"; Proceedings of the Institute of Radio Eingineers, vol. 24, No. 9; pp. 1163-1182; (Sep. 1936).

(Continued)

*Primary Examiner* — Hieu Nguyen
(74) *Attorney, Agent, or Firm* — McDonnell Boehnen Hulbert & Berghoff LLP (57) ABSTRACT

A Doherty amplifier has different drain voltages applied to the power transistors of the main and peaking stages. The impedance inverter comprises at least one first series phase shifting element between the output of the main amplifier and the Doherty amplifier output and at least one second series phase shifting element between the output of the peaking amplifier and the Doherty amplifier output. This provides a wideband combiner. The combination of this wideband combiner and different drain drive levels provides an improved combination of efficiency and bandwidth.

11 Claims, 5 Drawing Sheets

(56) References Cited

U.S. PATENT DOCUMENTS

2010/0148877 A1   6/2010 Oakley et al.
2012/0235734 A1   9/2012 Pengelly

OTHER PUBLICATIONS

Gustafsson, David, et al; "A Novel Wideband and Reconfigurable High Average Efficiency Power Amplifier"; IMS2012; 3 pages (2012).
Horiguchi, Kenichi et al; "Efficiency Enhancement of 250W Doherty Power Amplifiers Using Virtual Open Stub Techniques for UHF-band OFDM Applications"; IEEE Microwave Symposium Digest; pp. 1356-1359 (Jun. 1, 2006).
Wu, David Yu-Ting, et al; "A Modified Doherty Configuration for Braodband Amplification Using Symmetrical Devices"; IEEE Transactions on Microwave Theory and Techniques, vol. 60, No. 10; 13 pages. (Oct. 2012).
Wu, David Yu-Ting, et al; "Advances in Broadband Doherty Amplifier";IEEE International Microwave Symposium, Montreal, CN (Jun. 2012).
Sarbishaei, Hassan, et al; "Linearity of GaN HEMT RF Power Amplifiers—A circuit Perspecitve"; Presented at 2014 IEEE Radio & Wireless Week, Newport Beach, CA USA; 3 pages (Jan. 20, 2014).
Extended European Search report for application 13168944.0 (Feb. 17, 2014).

* cited by examiner

DOHERTY AMPLIFIER

CROSS-REFERENCE TO RELATED APPLICATIONS

This application claims the priority under 35 U.S.C. §119 of European patent application no. 13168944.0, filed on May 23, 2013, the contents of which are incorporated by reference herein.

The invention relates to an electronic device comprising a Doherty Amplifier ("DA") with an amplifier input and an amplifier output, wherein the amplifier has a main stage, and at least one peaking stage.

An amplifier of this type has an input network connecting the amplifier input to an input of the main stage and to an input of the peaking stage. An output network connects an output of the main stage and an output of the peaking stage to the amplifier output.

A classical DA has two amplifying stages arranged in parallel and of the same power capability. The first one of the stages (main stage) operates in a class-AB amplifier mode and the second one (peaking stage) operates in a class-C amplifier mode.

These stages are separated at their inputs and at their outputs by 90 degree phase shifting networks. The output phase shifting network has a specific characteristic impedance Zo which must be equal to the optimal load impedance RLm of the main stage. The input signal is split so as to drive the two amplifiers, and a summing network, known as an "impedance inverter" or a "Doherty combiner", is operative to:
  a) combine the two output signals,
  b) correct for phase differences between the two output signals, and
  c) provide an inverted impedance at the output of the DA with respect to the impedance as seen from the output of the main stage.

The Doherty amplifier addresses the problem that signals with significant amplitude modulation result in low average efficiency for the traditional power amplifier.

The classical Doherty amplifier is a so-called 2-way amplifier with a main stage and a single peaking stage. A multi-way (or N-way) Doherty amplifier has a main stage and a plurality of peaking stages operating in parallel. An advantage of a multi-way Doherty system is that it extends the back-off level beyond the symmetrical two way design without exhibiting significant drop in efficiency between the efficiency peaking points. As a result, an improvement of efficiency is possible at 12 dB power back-off, not at 6 dB back-off as for a symmetrical 2-way Doherty amplifier. The 12 dB power back-off is currently demanded by new communication systems such as 3 G-LTE (third generation long-term evolution) and WiMAX (Worldwide Interoperability for Microwave Access).

Typically, the main stage and the peaking stages are implemented using a respective power transistor as each of the respective stages.

This invention relates equally to two-way or N-way DA designs.

Figure 1:
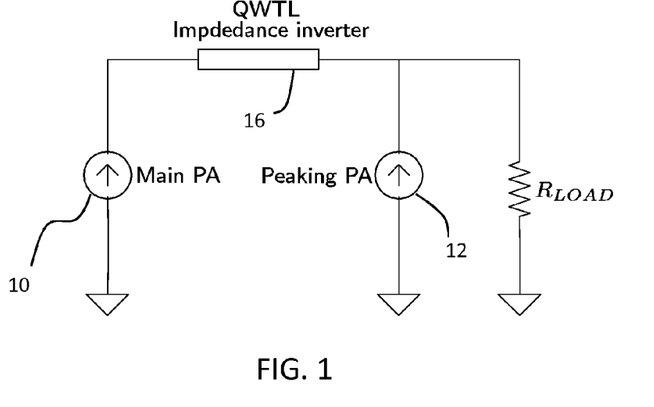
FIG. 1 shows an equivalent circuit for the basic known two way Doherty Power Amplifier (DPA)

An equivalent circuit of the classical two-way Doherty architecture is shown in FIG. 1. Two Power Amplifiers ("PAs"); a main amplifier 10 and a peaking amplifier 12 of equal power capacity, are driven by the input, with a λ/4 line at the input of the peaking amplifier 12 (not shown in the equivalent circuit). This functions as an impedance aligner. An impedance inverter 16 combines the output.

In a so-called "symmetric" Doherty power amplifier, the main and peaking amplifiers are of equal power capacity as mentioned above. An asymmetric Doherty power amplifier uses amplifiers of different power capacity. For example, by increasing the size of the peaking amplifier, higher efficiencies can be obtained at lower powers.

This design can be extended to N-ways to further improve the efficiency at deep back-off. For example, three-way DAs are a standard power amplifier device.

Figure 2:
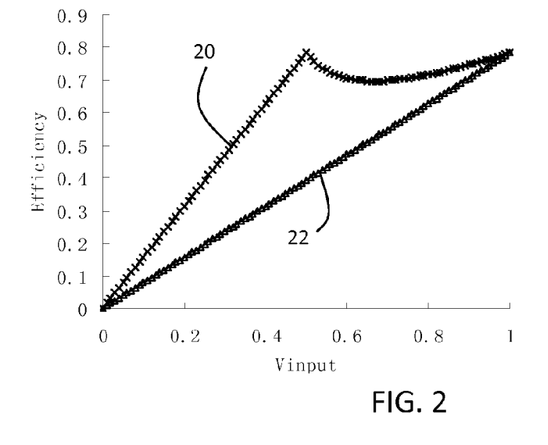
FIG. 2 compares the efficiency of the DPA of FIG. 1 with an ideal Class-B amplifier.

FIG. 2 shows the instantaneous efficiency of the two-way Doherty power amplifier of FIG. 1 (plot 20) as well as the efficiency of an ideal class-B amplifier (plot 22). The input λ/4 line dynamically modulates the load impedances of both main and peaking amplifiers as the input power level changes, improving the efficiency at back-off as shown in FIG. 2.

Doherty amplification is thus a well known technique for improving the power efficiency of RF transmitters when dealing with modulated signals that have high peak-to-average ratios e.g. MC-GSM, WCDMA and OFDM. In this context, power efficiency is defined as the ratio of average output power of the power amplifier to the DC input power.

Currently, Doherty power amplifiers ("DPAs") are also being applied to broadcast applications at sub-gigahertz frequencies for improving the average efficiency. The DPA concept is very successful in improving the average efficiency of the transmitters and can provide average efficiencies more than 50% for the modern WCDMA and MC-GSM signals and is being widely used in the current cellular as well as broadcast base-station transmitters.

However, the requirements of microwave transmitters are now shifting towards wider RF bandwidths along with high average efficiencies. For example, transmitted signals for the next generations of base-station transmitters have bandwidths in excess of 100 MHz and if the pre-distortion overhead on the bandwidth is included, the power amplifier for those signals need to handle signal bandwidths of more than 400 MHz.

Additionally, there is also a growing demand for multi-band high average efficiency power amplifiers. For example, in broadcast applications a multi-band DPA is required which can operate over a very wide bandwidth e.g. from 460 MHz to 860 MHz with an average efficiency drop of no more than 10 percentage points from its maximum value, and peak power drop of not more than 0.5 dB in the band.

The applicant has shown (but not yet published) that such wideband Doherty operation is possible with the use of an impedance inverter having two transmission lines—one comprising a quarter wavelength line and the other comprising a half wavelength line.

Figures 3, 4:
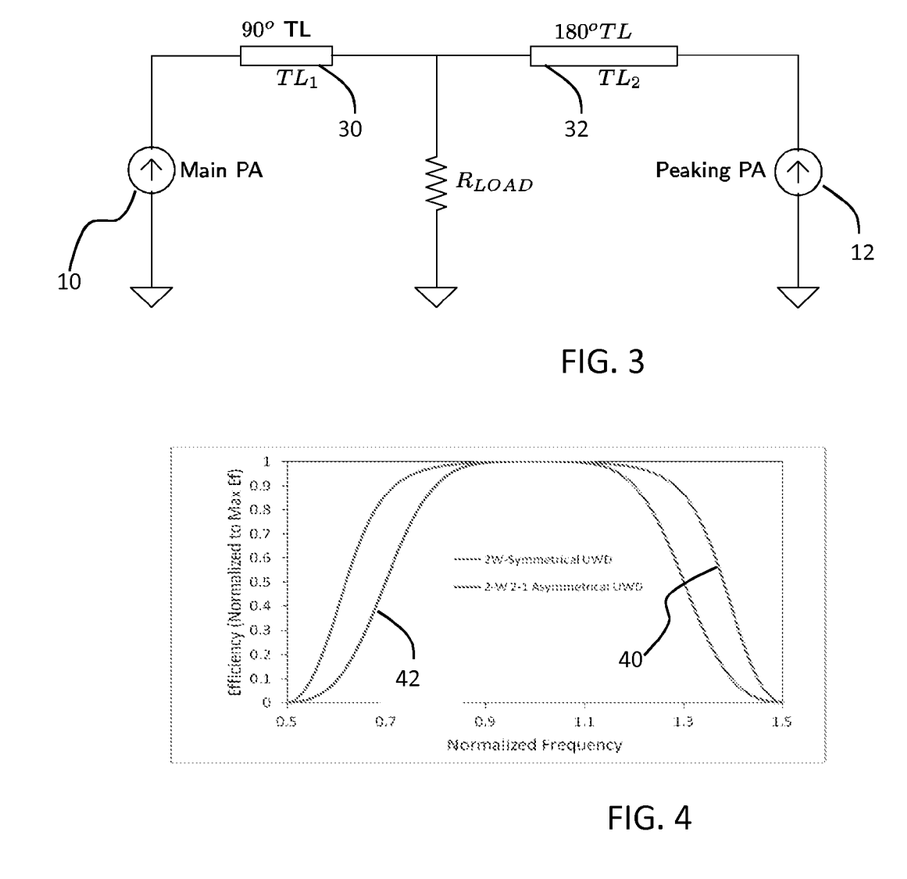
FIG. 3 shows an alternative impedance inverter proposed by the applicant.
FIG. 4 compares the efficiency of a symmetrical and asymmetrical two way DPA.

FIG. 3 shows the proposed system using two transmission lines. The main PA output is coupled to the load through a quarter wavelength transmission line, and the peaking PA output is coupled to the load through a half wavelength transmission line. This impedance inverter produces what will be termed an "ultra wideband Doherty amplifier" (UWD amplifier).

FIG. 4 shows the efficiency of a symmetrical two way circuit of FIG. 3 (plot 40) and a 2:1 asymmetrical two way circuit of FIG. 3 (plot 42). In a 2:1 design, the peaking amplifier has double the power of the main amplifier.

The average efficiency is increased if an asymmetric architecture is used (not shown in FIG. 4 as a result of the normalised axes), however, the bandwidth in that case is limited and inadequate for the broadcast requirements.

This approach in principle provides 70% fractional bandwidth (explained below). However, this bandwidth can only be provided if the load-modulation of the main device is limited to 2. This load modulation means that the load of the main amplifier is increased to higher values (e.g. 2 times the optimum load for symmetric PA and 3 times the optimum load for a for 2:1 asymmetrical PA) at back off power level.

As a consequence, the average efficiency obtained by a two-way system is moderate if coupled with 70% fractional bandwidth requirement.

Fractional bandwidth can be calculated by the following formula:

$$\text{Fractional bandwidth} = \frac{\Delta f}{f_{opt}}$$

$\Delta f$ is the efficiency bandwidth calculated by assuming that the relative efficiency falls by 10% at the band edges.

The bandwidth at the back-off power level depends upon the impedance transformation between the output node of the main amplifier and the output node of the full circuit.

In a two-way Doherty amplifier, this transformation is around 4.0 resulting in 28% bandwidth for the conventional Doherty design and 70% bandwidth if the Doherty combiner of FIG. 3 is used.

However for the full power case there are no bandwidth restrictions.

It has been reported that if this transformation is reduced to 1.0 (by choosing a different impedance of the transmission line between the nodes and different supply voltage for the main device) the bandwidth restrictions at the back-off power levels are removed, but the bandwidth restrictions now appear at full power level. This can be mitigated by using independent control of both inputs of the Doherty power amplifier.

The average efficiency can be increased if an asymmetric architecture is used, however, the bandwidth in that case is limited and inadequate for the broadcast requirements.

There are other proposed techniques to increase the bandwidth of Doherty amplifiers, by using asymmetrical drain voltages.

The article "A novel wideband and reconfigurable high average efficiency power amplifier" by David Gustafsson et. al. in IMS2012 discloses the idea of reducing the drain voltage of the main device to reduce the impedance transformation ratio between the combining point (which is the connection point wherein the main and peaking amplifier currents combine) and drain of the main amplifier at back-off power levels.

This reduced impedance transformation ratio results in better efficiency-bandwidth performance at back-off power levels. The power and efficiency performance at the full-power level is however limited because of the non-unity impedance transformation ratio between the combining point and drain terminal of the main device at full-power level.

Moreover, these techniques result in very low voltage at the main device. For example if the DPA is designed such that the second efficiency point of the amplifier is set −8.5 dB, the drain terminal voltage is reduced to ⅓ of its original voltage (18 volts if peaking is used at 50V). Therefore severe degradation of the output power of the main device results, the device provides only ⅓ of its rated power. This technique therefore does not allow taking full advantage of the rated powers of the PA devices.

According to the invention, there is provided an amplifier as claimed in claim 1.

The invention provides a Doherty amplifier comprising:
a main amplifier;
at least one peaking amplifier;
an input network connecting the Doherty amplifier input to the input of the main amplifier and to the input of the at least one peaking amplifier; and
an output network connecting an output of the main amplifier and an output of the at least one peaking amplifier to the Doherty amplifier output,
wherein the output network comprises at least one first series phase shifting element between the output of the main amplifier and the Doherty amplifier output and at least one second series phase shifting element between the output of the peaking amplifier and the Doherty amplifier output,
and wherein the peaking amplifier and drain amplifier comprise power transistors, wherein a different drain bias is applied to the transistors.

The invention combines a symmetrical combiner design of FIG. 3 with asymmetrical terminal voltages to combine the wideband bandwidth of the symmetrically driven two way DPA of FIG. 3 with the better average efficiency of an asymmetrical two way DPA, and without compromising performance at full power levels.

The first series phase shifting element can be a 90 degree transmission line at a frequency of interest and the second series phase shifting element can be a 180 degree transmission line at the frequency of interest. This provides an ultra wideband combiner design.

The impedance transformation ratio between the Doherty amplifier output and the main amplifier output is preferably between 2 and 4. This provides a balance between full and back-off power levels.

The main and peaking amplifiers preferably have the same power to provide a symmetrical configuration.

The amplifier preferably has a main amplifier voltage source connected to the drain of the main amplifier power transistor through a feed inductor and a peaking amplifier voltage source connected to the drain of the peaking amplifier power transistor through a feed inductor.

The drain bias applied to the peaking amplifier is preferably larger than the drain bias applied to the main amplifier.

The invention also provides a radio frequency transmitter comprising a Doherty amplifier of the invention The invention also provides an integrated circuit comprising a Doherty amplifier of the invention.

Examples of the invention will now be described in detail with reference to the accompanying drawings, in which.

The invention provides a Doherty amplifier which preferably has symmetric main and peaking amplifiers (i.e. the same power) but with different drain voltages applied to the power transistors of the main and peaking stages. The impedance inverter (the output network) comprises at least one first series phase shifting element between the output of the main amplifier and the Doherty amplifier output and at least one second series phase shifting element between the output of the peaking amplifier and the Doherty amplifier output. This provides a wideband combiner. The combination of this wideband combiner and different drain drive levels provides an improved combination of efficiency and bandwidth.

As discussed in the article "A novel wideband and reconfigurable high average efficiency power amplifier" referenced above, the bandwidth of the DPA at back-off power levels is dependent on the transformation ratio between the power combining point and the drain terminal of the main device.

This is also true for the wideband impedance inverter as shown in FIG. 3.

The efficiency plots of FIG. 4 enable the normalized bandwidth to be viewed for the wide band impedance inverter, for an impedance transformation ratio of 4 (for the symmetrical two way DPA of plot 40) and for an impedance transformation ratio 9 (for the asymmetrical 2:1 DPA of plot 42).

The bandwidth of the wideband impedance inverter (for the asymmetrical 2:1 case) is much reduced as compared to the symmetrical 2 W case.

The combination of the asymmetrical drain voltages and wideband impedance inverter can be used to reduce the transformation ratio of an asymmetrical two way DPA back to '4' instead of '9', which would in principle result in an asymmetrical wideband DPA with a bandwidth of a symmetrical two way DPA.

The impedance transformation ratios are not decreased to '1' therefore the resulting drain voltages are not too asymmetrical as in the case of the wideband amplifier made with conventional DPA combiner.

Figure 5:
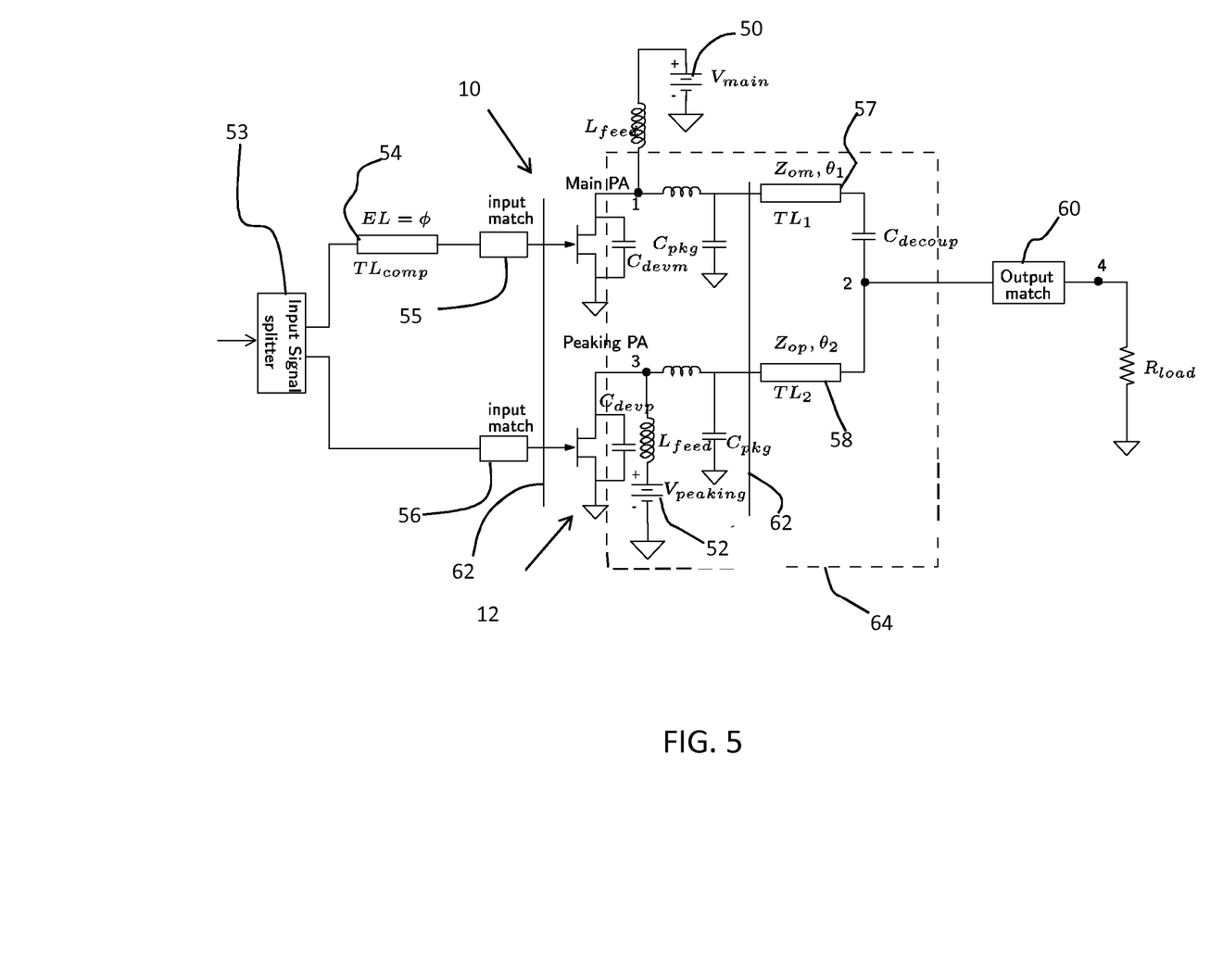
FIG. 5 shows the amplifier arrangement of the invention.

An example of the circuit of the invention is shown in FIG. 5.

FIG. 5 shows the main amplifier 10 as a transistor coupled with its source to ground, and the input applied to the gate. The drain is biased by a main voltage source 50 (Vmain) coupled by a feed inductor. The peaking amplifier 12 is shown as a transistor coupled with its source to ground, and the input applied to the gate. The drain is biased by a peaking voltage source 52 again coupled by a feed inductor.

The input signal is split by splitter 53. The main branch as a 90 degree transmission line 54 followed by an input matching impedance or circuit 55. The peaking branch has an input matching impedance or circuit 56.

The gate inputs to the transistors are the input terminals to the amplifier package, and they connect to input matching circuits 55.56.

The outputs (nodes 1 and 3) connect to the common combined output (node 2) through a 90 degree output impedance transformation circuit 57 and a 180 degree impedance transformation circuit 58 in the manner shown in FIG. 3.

An output matching circuit 60 is provided.

The output terminals of the amplifier package are the transistor drain terminals. The series terminal inductances and parallel package capacitances are also shown, so that lines 62 represent the boundaries of the integrated circuit package.

The output combiner is designed taking into account the parasitics of the power amplifier devices and the external components, as represented in the region 64.

The decoupling capacitor shown is used to separate the drain bias of the main and the peaking transistors.

The drain voltages are static voltages. By way of example, with Vdd_main=40V and Vdd_peak=50V, there would result an output power back-off point at 8 dB, impedance conversion ratio of 3.73, and load modulation factor of 2.5. The peaking bias voltage is higher than the main bias voltage, although the range will not be very large. For example with a 50V bias for the peaking amplifier, the main bias voltage will preferably be not lower than 32V, to prevent problems at full power levels. The peaking bias voltage can be between the main bias voltage and 1.5 times the main bias voltage.

This example of the invention uses an ultra-wide band Doherty combiner. The output capacitance and the package parasitics are used in the formation of the ultra-wideband Doherty combiner.

The transformation ratio is never reduced to 1. It is chosen between 2 and 4 to have balance between full and back-off power levels. For a conventional asymmetric DPA the transformation ratio is 9 for the classical Doherty design. The supply is chosen such that this transformation ratio is reduced to 4 (same as the case of the two-way symmetric DPA). Then by using the Doherty combiner, 70% fractional bandwidth is obtained by having improved back-off efficiency at 9.6 dB output power back-off.

The performance of the circuit of FIG. 5 will now be shown.

$V_{dcm}$=Drain voltage (DC) of the main device.
$V_{m\_knee}$=Knee voltage of the main device.
$V_{dcp}$=Drain voltage (DC) of the peaking device.
$V_{p\_knee}$=Knee voltage of the peaking device.
$R_{opt\_main}$=Optimum load of the main device.
$R_{opt\_peak}$=Optimum load of the peaking device.
$R_L$=Load at the combining point.
Y=Output power back-off.
K=Impedance transformation factor.
$I_{mm}$=Maximum current of main device.
$I_{pm}$=Maximum current of the peaking device.
$P_{main}$=Output power of the main device.
$P_{peaking}$=Output power of the peaking device.

The values of different circuit parameters are calculated by using output powers, drain voltage of the main and the peaking devices and the following equations (1-9).

The value of "K" obtained by the equation (7) below gives the estimate of the bandwidth obtained. Value of 4 indicates the bandwidth obtained is equivalent to a 2-way UWB Doherty and value of 9 indicates the bandwidth obtained equivalent to 2-way asymmetric 2:1 UWB Doherty. The output powers and drain voltages of the devices can be chosen to optimize "K" and "Y" for a certain bandwidth.

$$R_{opt\_main} = 0.5 \cdot \frac{(V_{dcm})^2}{P_{main}} \quad (1)$$

$$R_{opt\_peak} = 0.5 \cdot \frac{(V_{dcp})^2}{P_{peak}} \quad (2)$$

$$R_L = \frac{V_{pm}}{\left(I_{pm} + V_{mm}\frac{I_{mm}}{V_{pm}}\right)} \quad (3)$$

$$I_{mbo} = \frac{\left(V_{dcm}\frac{I_{mm}}{V_{dcp}}\right)}{\left(\frac{V_{dcm}}{V_{dcp}} + \frac{I_{pm}}{I_{mm}}\right)} \quad (4)$$

-continued $$LM = \frac{I_{mm}}{I_{mbo}} \quad (5)$$

$$\gamma = \frac{V_{dcm}I_{mbo}}{V_{dcm}I_{mm} + V_{dcp}I_{pm}} \quad (6)$$

$$K = LM \cdot \frac{R_{optmain}}{R_L} \quad (7)$$

$$Z_{om} = \frac{V_{dcp}}{I_{mm}} \quad (8)$$

$$Z_{op} = R_{optpeak} \quad (9)$$

To give an idea of the performance of the architecture, if a DPA is designed with 32V and 50V LDMOS technology, it would have bandwidth >65% and second efficiency point at −8.5 dB.

Figure 6:
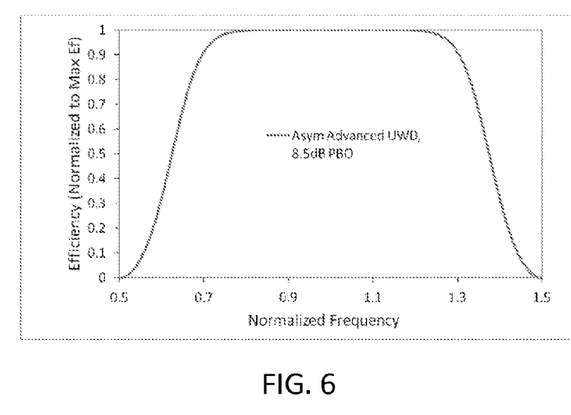
FIG. 6 shows the efficiency obtained by the approach of the invention.

The required efficiency plot is shown in FIG. 6.

Figure 7:
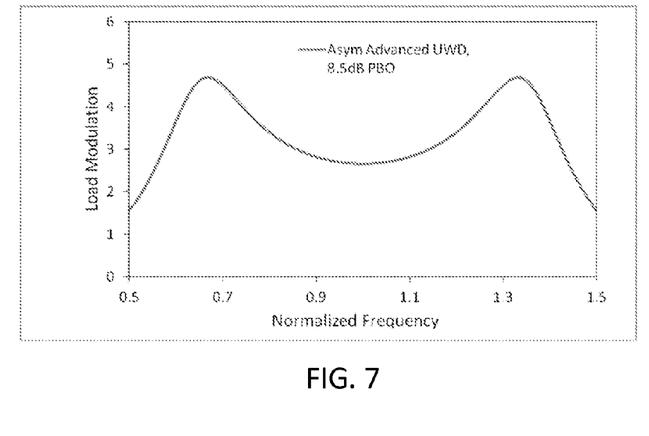
FIG. 7 shows the load modulation obtained by the approach of the invention.
Figure 8:
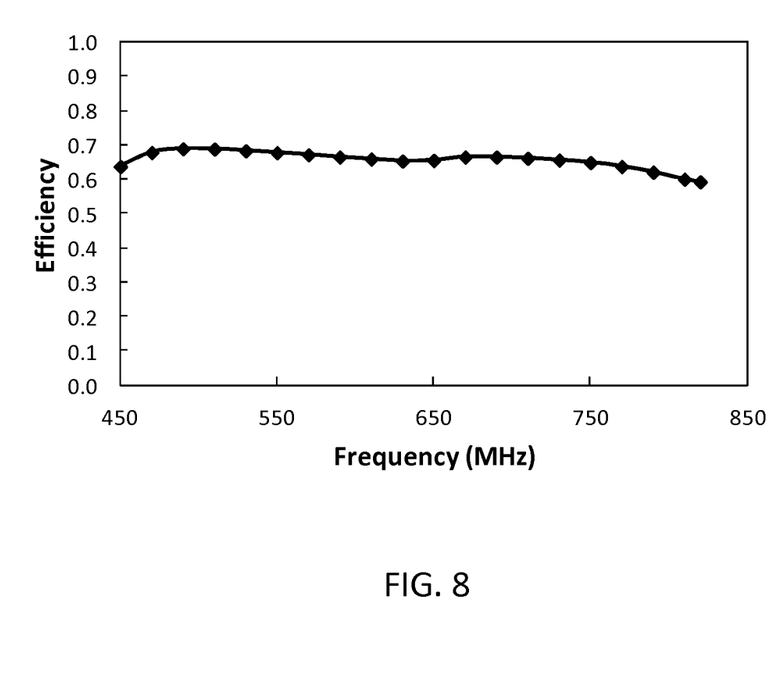
FIG. 8 shows the efficiency as a function of frequency.

Additionally the load-modulation at the band edges is much higher than the centre frequencies as shown in FIG. 7, which means that the main PA device would operate more efficiently at the band edges. Additionally, there is no need to de-rate any PA device in this case; both PA devices in this configuration operate at their rated power levels.

The invention thus provides the use of an UWD (ultra wideband) combiner with asymmetrical drain voltages to improve the bandwidth response of the PA. The characteristic impedance of the transmission lines in the wideband DPA combiner and impedance at the combing point is adjusted in a way that the impedance transformation ratio is reduced (equivalent to 2-W UWD) at the back-off power levels in the case of asymmetrical DPA design resulting in higher efficiency performance.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A Doherty amplifier comprising:
a main amplifier;
at least one peaking amplifier;
an input network connecting the Doherty amplifier input to the input of the main amplifier and to the input of the at least one peaking amplifier; and
an output network connecting an output of the main amplifier and an output of the at least one peaking amplifier to an output of the Doherty amplifier,
wherein the output network comprises at least one first series phase shifting element between the output of the main amplifier and a combining node, and at least one second series phase shifting element between the output of the peaking amplifier and the combining node, the output network further comprising an output match arranged in between the combining node and the output of the Doherty amplifier, and
wherein the peaking amplifier includes a peaking power transistor and the main amplifier includes a main power transistor, wherein a different drain bias is applied to the peaking power transistor than is applied to the main power transistor;
wherein the first series phase shifting element comprises a transmission line having a predefined characteristic impedance and configured for introducing a phase shift of 90 degrees at a frequency of interest and the second series phase shifting element comprises a transmission line having a predefined characteristic impedance and configured for introducing a phase shift of 180 degrees at the frequency of interest;
wherein an impedance transformation by the second series phase shifting element is essentially independent from input power supplied to the Doherty amplifier.

2. An amplifier as claimed in claim 1,
wherein the second series phase shifting element has a first terminal connected to the at least one peaking amplifier and a second opposing terminal, wherein a 180 degrees phase shift exists between the first and second terminals, wherein the impedance transformation is a transformation from impedance seen at the second opposing terminal looking away from the second series phase shifting element and impedance seen at the first terminal looking into the second series phase shifting element.

3. An amplifier as claimed in claim 1,
wherein the second series phase shifting element has a predefined characteristic impedance that is constant over its length.

4. An amplifier as claimed in claim 1, wherein the main and peaking amplifiers have the same power.

5. An amplifier as claimed in claim 1, comprising
a main amplifier voltage source connected to the drain of the main amplifier power transistor through a feed inductor and a peaking amplifier voltage source connected to the drain of the peaking amplifier power transistor through a feed inductor; and
wherein the main source applies a first drain bias to the main amplifier and the peaking source applies a second, different drain bias to the peaking amplifier.

6. An amplifier as claimed in claim 1,
wherein the drain bias applied to the peaking amplifier is larger than the drain bias applied to the main amplifier.

7. A radio frequency transmitter comprising a Doherty amplifier as claimed in claim 1.

8. An integrated circuit comprising a Doherty amplifier as claimed in claim 1.

9. The Doherty amplifier of claim 1:
wherein the output network is an impedance inverter.

10. The Doherty amplifier of claim 1:
wherein the output network is a summing network.

11. The Doherty amplifier of claim 1:
wherein the output network is a Doherty combiner.

* * * * *